United States Patent [19]

Yokoyama

[11] Patent Number: 4,794,650
[45] Date of Patent: Dec. 27, 1988

[54] ELECTRONIC TUNING RECEIVER

[75] Inventor: Hajime Yokoyama, Saitama, Japan

[73] Assignee: Toko, Inc., Tokyo, Japan

[21] Appl. No.: 71,299

[22] Filed: Jul. 9, 1987

[30] Foreign Application Priority Data

Jul. 10, 1986 [JP] Japan .................................. 61-162400

[51] Int. Cl.⁴ ................................................ H04B 1/26
[52] U.S. Cl. ................................ 455/197; 331/177 V; 334/15; 455/195
[58] Field of Search .................. 455/193, 195–197, 455/262; 331/36 C, 177 V; 334/15

[56] References Cited

U.S. PATENT DOCUMENTS

| 3,249,876 | 5/1966 | Harrison | 331/36 C X |
| 3,784,917 | 1/1974 | Kenyon | 331/36 C X |
| 4,450,416 | 5/1984 | Mears | 331/177 V X |
| 4,628,540 | 12/1986 | Hendriks | 455/197 |
| 4,658,437 | 4/1987 | Ersoz et al. | 455/197 X |

Primary Examiner—Paul Gensler

[57] ABSTRACT

A receiver equipped with an electronic tuning circuit which uses voltage-variable reactance elements such as variable-capacitance diodes or the like in the radio-frequency tuning circuit and oscillation tuning circuit thereof. The oscillation tuning circuit includes a novel padding capacitor constituted by a composite circuit of a variable-capacitance diode and fixed capacitors connected at the position where a conventional padding capacitor is connected. With such an arrangement, it is possible to make tracking error negligibly small over a frequency band ranging from a low receiving frequency to a high receiving frequency, by applying a tuning voltage to the composite padding capacitor.

3 Claims, 4 Drawing Sheets

ELECTRONIC TUNING RECEIVER

BACKGROUND OF THE INVENTION

1. Field of the Invention

This invention relates to an electronic tuning receiver using voltage-variable reactance elements in the radio-frequency tuning circuit and oscillation tuning circuit thereof, whereby tracking error is substantially eliminated over the receiving frequency band ranging from a low to a high receiving frequency.

2. Description of the Prior Art

In order to have a better understanding of the present invention, description will first be made of an example of conventional medium wave electronic tuning receiver shown in FIG. 1 of the drawings, wherein variable-capacitance diodes $D_1$ and $D_2$ of equal capacitance and adapted to serve as voltage-variable reactance elements are employed in a radio-frequency tuning circuit such as, for example, antenna tuning circuit 2, and an oscillation tuning circuit 3.

In FIG. 1, the antenna tuning circuit 2 comprising a tuning coil $L_1$ and a capacitor $C_1$ which are connected in parallel with each other; a DC blocking capacitor $C_{P4}$ having one terminal thereof connected to one connection point between the tuning coil $L_1$ and capacitor $C_1$; and a variable-capacitance diode $D_1$ having the cathode thereof connected to the other terminal of the DC block capacitor $C_{P4}$, the anode of the variable-capacitance diode $D_1$ being connected to the other connection point between the tuning coil $L_1$ and capacitor $C_1$, and grounded. The oscillation tuning circuit 3 comprises an oscillation coil $L_2$ and capacitor $C_2$ which are connected in parallel with each other; a padding capacitor $C_{P5}$ having one terminal thereof connected to one connection point between the oscillation coil $L_2$ and capacitor $C_2$; and a variable-capacitance diode $D_2$ having the cathode thereof connected to the other terminal of the padding capacitor $C_{P5}$, the anode of the variable-capacitance diode $D_2$ being connected to the other connection point between the oscillation coil $L_2$ and capacitor $C_2$, and grounded. Furthermore, a variable voltage source E is connected to the connection point between the variable-capacitance diodes $D_1$ and the DC blocking capacitor $C_{P4}$ through a resistor $R_0$ and also to the connection point between the variable-capacitance diode $D_2$ and the padding capacitor $C_{P5}$ through a resistor $R_1$. The variable voltage source E can be set up to a predetermined tuning voltage by means of a PLL synthesizer.

In conventional electronic tuning receiver shown in FIG. 1, a tuning voltage is applied to the variable-capacitance diodes $D_1$ and $D_2$ to select a desired frequency. However, such a superheterodyne receiver is disadvantageous in that tracking error inevitably occurs from a logical point of view.

FIG. 2 shows the relationships between the tracking error and receiving frequency which occur with a medium wave band receiver such as shown in FIG. 1, wherein tracking error curve (A) indicates tracking error which tends to occur with the conventional receiver, from which it will be seen that it is at only three points b, d and f, i.e., at the points of a low receiving frequency (600 KHz), medium receiving frequency (1000 KHz) and high receiving frequency (1400 KHz) tracking error becomes zero, and that at the other receiving frequency points, tracking error 5 to 10 KHz at a maximum occurs.

The aforementioned medium wave band receiver includes factors to deteriorate the receiving sensitivity. With an AM stereo receiver, for example, there is a tendency that variations in stereo separation degree and side band level, phase shift and so forth are caused so that the broadcast quality is remarkably degraded. Thus, it has so far been desired that tracking error be eliminated.

Furthermore, in the conventional medium wave band receiver, an extremely great tracking error occurs at a receiving frequency in the vicinity of 1700 KHz, and thus with such a receiver using the conventional electronic tuning circuit as it is, problems arise from the standpoint of practical use.

SUMMARY OF THE INVENTION

Accordingly, the present invention has been made with a view to solving the aforementioned problems. It is a primary object of the present invention to provide an electronic tuning circuit which is so designed that tracking error is substantially eliminated over the receiving frequency band ranging from a low to a high receiving frequency.

Another object of the present invention is to provide an electronic tuning circuit which is designed such that tracking error is reduced over a frequency range up to a point in the neighborhood of 1700 KHz to such an extent that no substantial problems arise from the standpoint of practical use.

Briefly stated, according to the present invention, there is provided an electronic tuning circuit which uses voltage-variable reactance elements in the radio-frequency tuning circuit and oscillation tuning circuit thereof. Padding capacitor for the oscillation tuning circuit includes a voltage-variable reactance element such as variable-capacitance diode or the like, and the capacitance of the voltage-variable reactance element is varied with a tuning voltage so that tracking error is substantially eliminated over the entire receiving frequency band ranging from a low to a high receiving frequency. More specifically, the design is made such that the capacitance of the padding capacitor is increased for a low receiving frequency and decreased for a medium or high receiving frequency, thereby making zero tracking error which occurs with the conventional circuit inevitably from the logical standpoint.

Other objects, features and advantages of the present invention will become apparent from the ensuing description taken in conjunction with the accompanying drawings.

DESCRIPTION OF THE PREFERRED EMBODIMENTS

Figure 1:
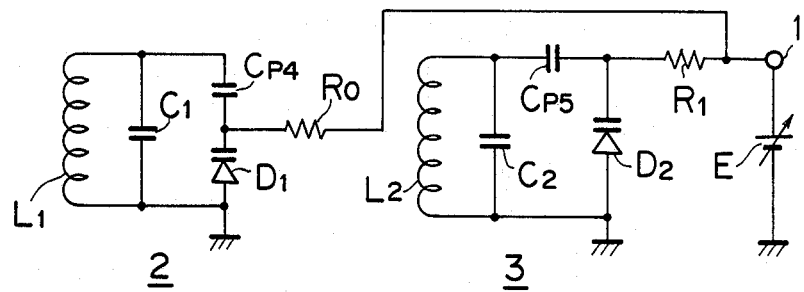
FIG. 1 is a circuit diagram showing a radio-frequency tuning circuit and an oscillation tuning circuit of a conventional electronic tuning receiver.
Figure 3:
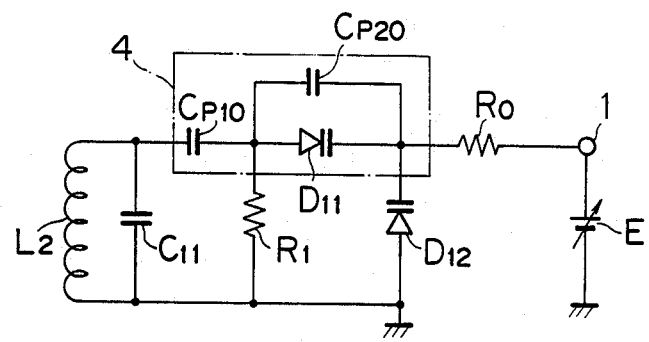
FIG. 3 is a circuit diagram showing the local oscillator circuit of the electronic tuning receiver according to a first embodiment of the present invention.
Figure 4:
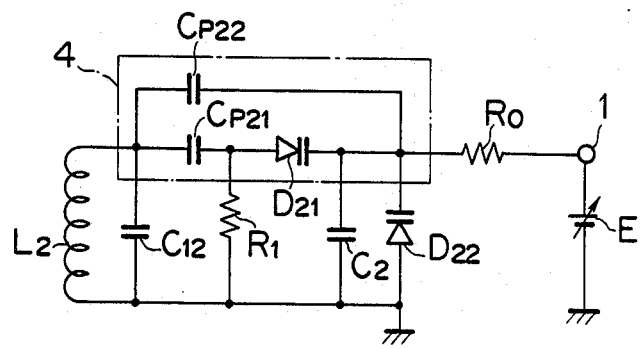
FIG. 4 is a circuit diagram showing the local oscillator circuit of the electronic tuning receiver according to a second embodiment of the present invention.
Figure 5:
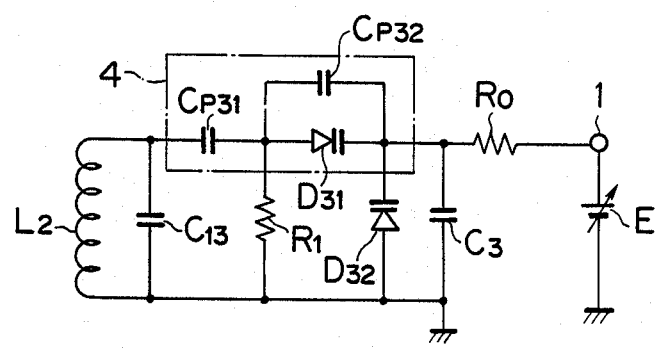
FIG. 5 is a circuit diagram showing the local oscillator circuit of the electronic tuning receiver according to a third embodiment of the present invention.

Referring to FIGS. 3 to 5, there are shown the electronic tuning receivers according to a first, a second and a third embodiment of the present invention, respectively, wherein only the oscillation tuning circuit is shown, and the antenna tuning circuit is omitted just for the sake of convenience. The antenna tuning circuit of the arrangement shown in FIG. 1 may be used.

The oscillation tuning circuit shown in FIG. 3 comprises an oscillation coil $L_2$ and capacitor $C_{11}$ which are connected in parallel with each other; a second capacitor $C_{P10}$ having one terminal thereof connected to one connection point between the oscillation coil $L_2$ and the capacitor $C_{11}$; a third capacitor $C_{P20}$ having one terminal thereof connected to the other terminal of the capacitor $C_{P10}$; a variable-capacitance diode $D_{11}$ having the anode thereof connected to the connection point between the capacitor $C_{P10}$ and the $C_{P20}$, the cathode of the variable-capacitance diode $D_{11}$ being connected to the other terminal of the capacitor $C_{P20}$; a bias resistor $R_1$ having one terminal thereof connected to the connection point between the capacitors $C_{P10}$ and $C_{P20}$ and the anode of the variable-capacitance diode $D_{11}$; and a second variable-capacitance diode $D_{12}$ having the cathode thereof connection to the connection point between the cathode of the variable-capacitance diode $D_{11}$ and the capacitor $C_{P20}$. The other connection point between the oscillation coil $L_2$ and parallel capacitor $C_{11}$, the other terminal of the bias resistor $R_1$, and the anode of the variable-capacitance diode $D_{12}$ are grounded. The capacitors $C_{P10}$ ad $C_{P20}$ and the variable-capacitance diode $D_{11}$, in combination, constitutes a padding capacitor 4 which will be explained in detail hereinbelow. Furthermore, a variable voltage source E is connected to provide a tuning voltage to the connection point between the variable-capacitance diodes $D_{11}$ and $D_{12}$ through a resistor $R_0$ so that the electronic tuning receiver is preset to a desired receiving frequency. The tuning voltage is set up by using a PLL synthesizer or the like.

The capacitance of the padding capacitor 4, which comprises the capacitors $C_{P10}$ and $C_{P20}$ and the variable-capacitance diode $D_{11}$ as mentioned above, is variable with the tuning voltage provided by the variable voltage source E. The combined capacitance $C_{P(1)}$ of the padding capacitor is given by the following equation:

$$C_{P(1)} = \frac{C_{P10}(C_{P20} + C_{D11})}{C_{P10} + C_{P20} + C_{D11}} \quad (1)$$

where $C_{P10}$ and $C_{P20}$ represent the capacitance values of the capacitors $C_{P10}$ and $C_{P20}$ respectively, and $C_{D11}$ indicates the capacitance value of the variable-capacitance diode $D_{11}$.

Tuning voltage is applied to the cathode of the variable-capacitance diode $D_{11}$ included in the padding capacitor 4. The bias resistor $R_1$ is connected to the anode of the variable-capacitance diode $D_{11}$ as mentioned above. The capacitance value of the variable-capacitance diode $D_{12}$, and that of the variable-capacitance diode $D_{11}$ included in the padding capacitor 4 are variable with tuning voltage applied by the variable voltage source E. Thus, the capacitance value of the padding circuit 4 is variable with variations in the capacitance value $C_{D11}$ of the variable-capacitance diode $D_{11}$ in accordance with the above equation (1).

Figure 2:
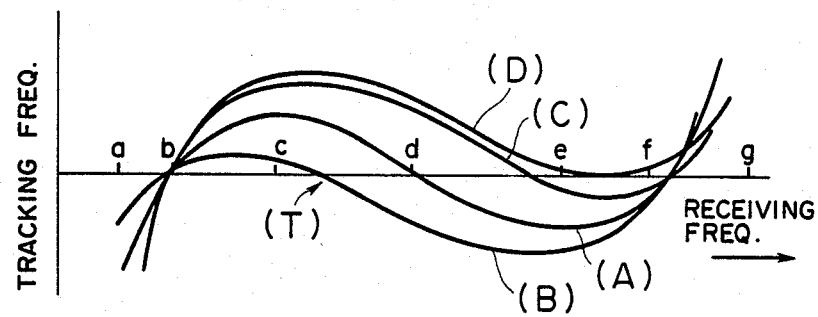
FIG. 2 is a view showing how tracking error varies with changes in the capacitance of a padding capacitor in an electronic tuning receiver.

Referring to FIG. 2, description will now be made as to how tracking error varies with variations in the capacitance of the padding capacitor. If it is assumed that the capacitance of the padding capacitor is greater than that of an ordinary padding capacitor with which medium band tracking error becomes substantially zero at about 1000 KHz, then tracking error at low receiving frequency will be reduced as shown at (B) in FIG. 2. Curve C shows a state in which the point where the tracking error becomes zero is shifted to a higher frequency region, by charging the capacitance of padding capacitor 4. As the capacitance of the padding capacitor is decreased, tracking error at high receiving frequency will be reduced as indicated at (D) in FIG. 2. Thus, a point (T) where the tracking error at medium receiving frequency becomes zero is shifted toward higher receiving frequency as the capacitance of the padding capacitor is decreased.

As will be appreciated, the electronic tuning circuit according to the present invention utilizes the feature that the point where tracking error at medium receiving frequency becomes zero, is shifted by changing the capacitance of the padding capacitor as mentioned above. According to the present invention, the shifting characteristic of the zero point (T) is determined by selecting the capacitance values of the variable-capacitance diode $D_{11}$ and the capacitors $C_{P10}$ and $C_{P20}$ (capacitors $C_{P21}$ and $C_{P22}$ and a variable-capacitance diode $D_{21}$ in FIG. 4; and capacitors $C_{P31}$ and $C_{P32}$ and a variable-capacitance diode $D_{31}$ in FIG. 5). To make substantially zero the tracking error over the entire receiving frequency band, the capacitance of the padding capacitor 4 provided in the form of a composite circuit is varied with the receiving frequency.

Figure 6:
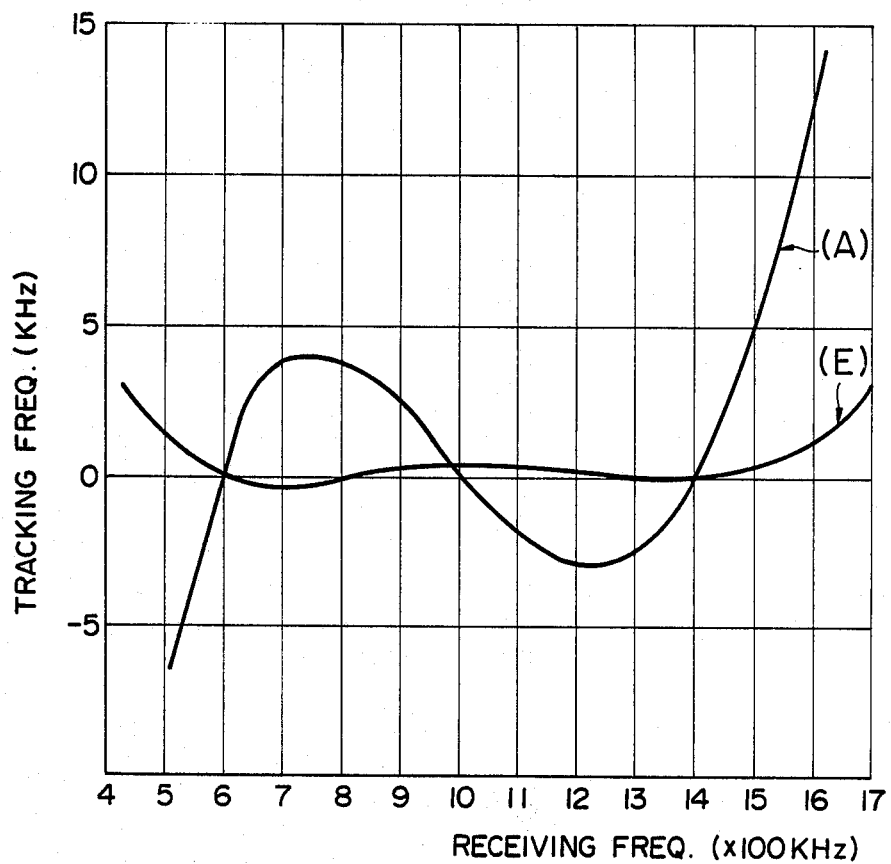
FIG. 6 is a view showing the tracking error characteristics of the electronic tuning receiver embodying the present invention.

The circuit constants for the oscillation tuning circuit of the electronic tuning receiver according to this invention shown in FIG. 3 are described in Table 1, and the tracking error curve of the receiver is illustrated in FIG. 6.

TABLE 1

| | |
|---|---|
| Variable-capacitance diode $D_{11}$ | 477 to 30.5 (PF) |
| Capacitor CP10 | 626 (PF) |
| Capacitor CP20 | 412 (PF) |
| Parallel capacitor C11 | 6.032 (PF) |
| Oscillation coil L2 | 121.34 ($\mu H$) |

The tracking error curve of the electronic tuning receiver according to the present invention will be explained with reference to FIG. 6, wherein the horizontal axis indicates receiving frequency, and the vertical axis shows tracking frequency. In FIG. 6, a tracking error curve (A) represents the characteristic of the conventional electronic tuning receiver, and a tracking error curve (E) indicates the characteristic of the electronic tuning receiver according to the present invention. As will be appreciated, with the electronic tuning circuit formed by using the circuit constants shown above, it is possible to make substantially zero the tracking frequency over the receiving frequency band (500 KHz to 1700 KHz).

Description will now made made of the oscillation tuning circuit of the embodiment shown in FIG. 4, which comprises an oscillation coil $L_2$ and capacitor $C_{12}$ which are connected in parallel with each other; capacitors $C_{P21}$ and $C_{P22}$ each having one terminal connected to one connection point between the coil $L_2$ and the capacitor $C_{12}$; a variable-capacitance diode $D_{21}$ having the anode thereof connected to the other terminal of the capacitor $C_{P21}$, the cathode of the variable-capacitance diode $D_{21}$ being connected to the other terminal of the capacitor $C_{P22}$; and a capacitor $C_2$ connected in parallel with the variable-capacitance diode $D_{21}$. Indicated at 4 is a padding capacitor, the combined capacitance $C_{P(2)}$ of which is given by:

$$CP(2) = \frac{CP21 \times CD21}{CP21 + CD21} + CP22 \quad (2)$$

where $C_{P21}$ and $C_{P22}$ represent the capacitance values of the capacitors $C_{P21}$ and $C_{P22}$ respectively, and $C_{D21}$ indicates the capacitance value of the variable-capacitance diode $D_{21}$.

As will be noted, the oscillation tuning circuit of the embodiment shown in FIG. 5 is identical with that of FIG. 3, except that a parallel capacitor $C_3$ is additionally provided, the value for which may be 20,6 pF, for the purpose of improving the tracking error chararacteristic. The manner in which the parallel capacitors are used, differs between the case where variable-capacitance diodes $D_{31}$ and $D_{32}$ are used as elements having equal capacitance values and the case where the two variable-capacitance diodes are used as elements having different capacitance values. Although not shown, it is possible either only the parallel capacitor $C_3$ or the parallel capacitor $C_{13}$ may be employed in FIG. 5.

By employing the circuit constants shown in Table 1, it is possible to seek the capacitance value of the padding capacitor 4 for the case where the capacitance values of the variable-capacitance diodes $D_{11}$ and $D_{21}$ are maximum and for the case where such capacitance values are minimum. More specifically, by substituting the values of Table 1 for the equation (1), the combined capacitance value $C_{P(1)}$ of the padding capacitor for the case the capacitance value of the variable-capacitance diode $D_{11}$ is maximum (477 pF), is given as follows:

$$CP(1) = \frac{626(412 + 477)}{626 + 412 + 477} = 367.33$$

For the case where the variable-capacitance diode $D_{11}$ is minimum (30.5 pF), on the other hand, the capacitance value of the padding capacitor is given as follows:

$$CP(1) = \frac{626(412 + 30.5)}{626 + 412 + 30.5} = 259.2$$

Thus, the combined capacitance $C_{P(1)}$ of the padding capacitor can be varied in the range from 367.33 pF to 259.2 pF by changing the capacitance value of the variable-capacitance diode $D_{11}$. It has been proved that the capacitance of the padding capacitor 4 works to make the tracking error curve substantially flat over the entire receiving frequency band as shown at (E) in FIG. 6, by virtue of the fact that a difference of about 100 pF occurs in the capacitance value of the variable-capacitance diode as the tuning voltage is changed from maximum to minimum.

Care should be taken in an attempt to set up the value for the parallel capacitor since the oscillation coil usually represents stray capacitance of about 4 pF. In the case where the stray capacitance across the oscillation coil $L_2$ is 6 pF, then there is no need to provide the parallel capacitor $C_{11}$.

Figure 7:
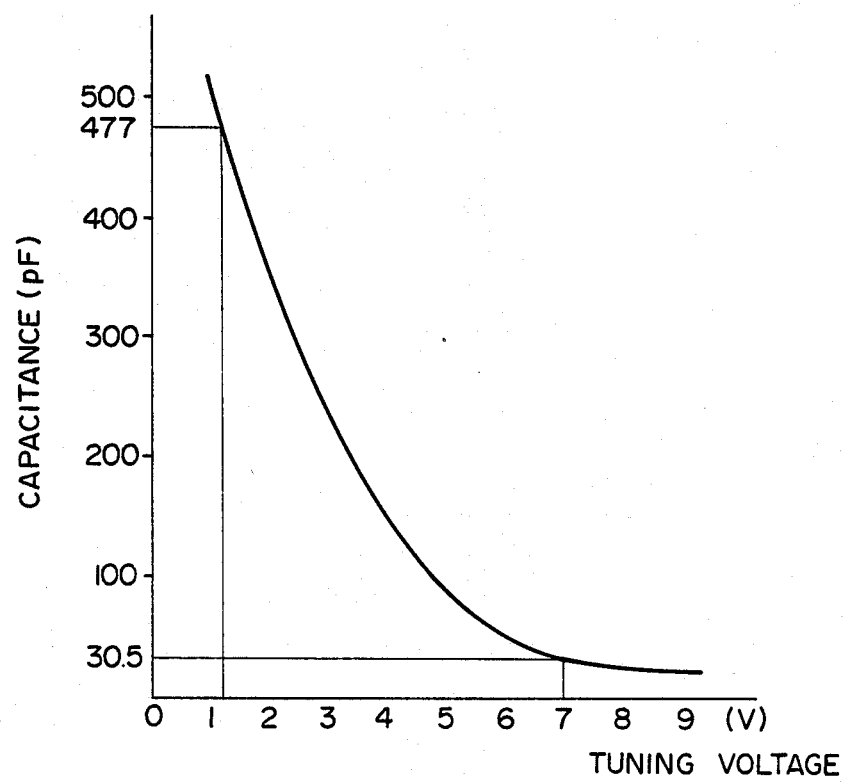
FIG. 7 is a view showing the characteristic of a variable-capacitance diode which can be employed with the electronic tuning receiver according to the present invention.

In the foregoing embodiments of the present invention, each of the variable-capacitance diodes was selected as having such characteristics that the capacitance value thereof is variable in the range from about 500 pF to 30 pF as the tuning voltage is changed from 1 V to 9 V, as illustrated in FIG. 7. It goes without saying that a variable-capacitance diode which represents a greater capacitance variation per unit voltage applied thereto, will work more efficiently. It is to be understood that the characteristic of the variable-capacitance diode is by no means limited to that as illustrated in FIG. 7.

As will be appreciated from the above discussion, in the electronic tuning receiver according to the present invention, the padding capacitor of the local oscillator circuit is constituted by a composite circuit including a variable-capacitance diode, and tuning voltage is applied to the padding capacitor; thus, with such an arrangement, tracking error can be reduced over a receiving frequency band of 500 KHz to 1700 KHz. In this way, according to the present invention, there is provided a receiver equipped with an electronic tuning circuit designed to minimize tracking error, which may be most effectively applicable to AM stereo receivers. Furthermore, according to the present invention, it is also possible to achieve an improved receiving sensitivity without effecting tracking adjustment.

While the present invention has been illustrated and described with respect to some specific embodiments thereof, it is to be understood that the present invention is not limited thereto but encompasses all changes and modifications which will become possible within the scope of the appended claims.

I claim:

1. An electronic tuning receiver comprising a radio-frequency tuning circuit and an oscillation tuning circuit including a first and a second voltage-variable reactance element, an oscillation coil, a first capacitor connected in parallel with said oscillation coil, and a padding capacitor provided in the form of a composite circuit, said padding capacitor containing a second capacitor connected in series with said oscillation coil, said first voltage-variable reactance element, and a third capacitor connected parallel with at least one of said second capacitor and a first voltage-variable reactance element, the capacitance of said padding capacitor being variable over a frequency band ranging from a low receiving frequency to a high receiving frequency, by changing the capacitance of said first voltage-variable reactance element with that of said second voltage-variable reactance element.

2. An electronic tuning receiver according to claim 1, wherein said oscillation tuning circuit further includes a fourth capacitor connected in parallel with said second voltage-variable reactance element, said third capacitor is connected in parallel with said second capacitor and said first voltage-variable reactance element, and said padding capacitor is connected to one connection point between said oscillation coil and said first capacitor.

3. An electronic tuning receiver according to claim 1, wherein said padding capacitor is connected to one connection point between said oscillation coil and said first capaacitor, each of said second and third capacitors has a first and a second terminal, said second and third capacitors being connected at the first terminals thereof to one connection point between said oscillation coil and said first capacitor, and said first voltage-variable reactance element has a first and second terminal, the first terminal of the first voltage-variable reactance element being connected to the second terminal of saaid second capacitor, the second terminal of the first voltage-variable reactance element being connected to the second terminal of the said third capacitor.

* * * * *